United States Patent [19]

Kusagaya

[11] Patent Number: 5,492,233
[45] Date of Patent: Feb. 20, 1996

[54] MANUFACTURING METHOD FOR LEAD FRAME

[75] Inventor: Toshihiro Kusagaya, Kawasaki, Japan

[73] Assignee: Fujitsu Limited, Kawasaki, Japan

[21] Appl. No.: 351,207

[22] Filed: Nov. 30, 1994

[30] Foreign Application Priority Data

Mar. 15, 1994 [JP] Japan .................................. 6-044190

[51] Int. Cl.$^6$ .................................................. B44C 1/22
[52] U.S. Cl. ............................................. 216/14; 216/41
[58] Field of Search ................... 216/14, 41; 156/651.1, 156/661.11; 29/827; 437/182, 220

[56] References Cited

U.S. PATENT DOCUMENTS 4,289,846  9/1981  Parks et al. ......................... 437/182 X
4,711,700  12/1987  Cusack .................................... 216/14
5,004,521  4/1991  Makino .................................... 216/14

Primary Examiner—William Powell
Attorney, Agent, or Firm—Armstrong, Westerman, Hattori, McLeland & Naughton

[57] ABSTRACT

Disclosed herein is a manufacturing method for a lead frame, including the steps of forming a lead element, forming masks on a first surface and a second surface of the lead element, etching the lead element, and removing the masks. According to this method, the lead frame can be manufactured at low costs without the necessity of machining of the lead element.

5 Claims, 4 Drawing Sheets

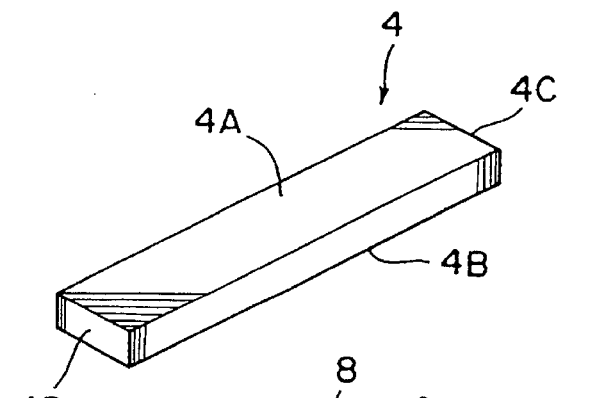
FIG.2A
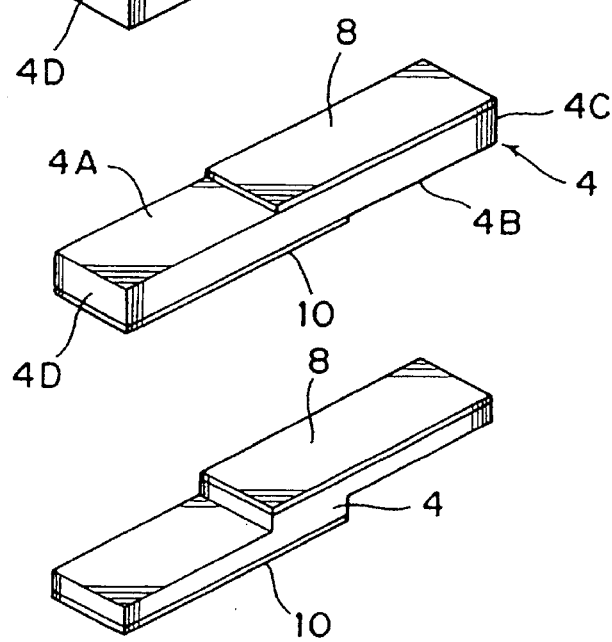
FIG.2B
FIG.2C
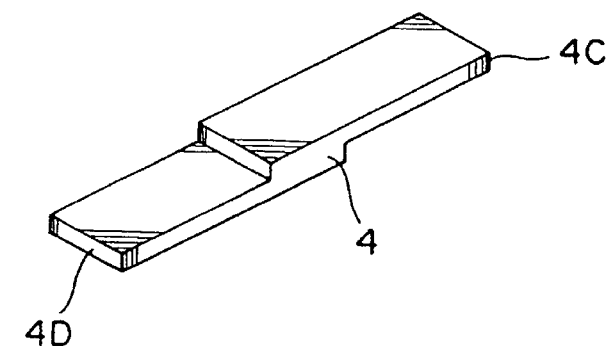
FIG.2D

MANUFACTURING METHOD FOR LEAD FRAME

BACKGROUND OF THE INVENTION

1. Field of the Invention

The present invention relates to a manufacturing method for a lead frame applicable to mounting of an integrated circuit or the like.

2. Description of the Related Art

Various methods for mounting an integrated circuit on a printed wiring board have recently been developed. Above all, a mounting technique using a lead frame is widely spread owing to its reliability and low-cost productivity. The mounting technique using the lead frame is also applied to the case of mounting on a mother board a multichip module (MCM) having a plurality of bare IC chips mounted on a substrate. Then, improvement suited for a reduction in cost in manufacturing method for a lead frame has now been desired.

Known as a conventional manufacturing method for a lead frame is a method including the steps of forming a plurality of lead elements by blank etching, for example, and then mechanically deforming the lead elements to form a crank shape of each lead frame.

In the case of applying such a lead frame to a multichip module, the plural lead elements integrally connected together after blank etching are first mounted on the multichip module, and thereafter each lead element is subjected to mechanical deformation (lead forming) and cutting. Accordingly, it is necessary to prepare individual machines for performing the lead forming and the cutting suitable for various forms of the multichip module. As a result, a manufacturing cost for the lead frame is increased.

SUMMARY OF THE INVENTION

It is therefore an object of the present invention to provide a manufacturing method for a lead frame which eliminates the necessity of mechanical deformation of a lead element and is suited to a reduction in cost.

According to the present invention, there is provided a manufacturing method for a lead frame, comprising the first step of forming an elongated lead element having a first surface and a second surface parallel to each other; the second step of forming a first mask on said first surface so that said first mask extends from a first end of said lead element toward a second end of said lead element and terminates at a mid position between said first end and said second end, and forming a second mask on said second surface so that said second mask extends from said second end toward said first end and terminates at a mid position between said second end and said first end; the third step of etching said first surface and said second surface of said lead element; and the fourth step of removing said first mask and said second mask.

Preferably, said lead element comprises a plurality of lead elements, and said first step comprises the step of forming said plurality of lead elements by blank etching.

According to the method of the present invention, the first surface and the second surface of the elongated lead element are masked at specified portions, and the lead element thus masked is subjected to etching. Accordingly, the crank shape of the lead frame can be formed without the necessity of mechanical deformation, thereby reducing a manufacturing cost.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 2A, 2B, 2C, and 2D are perspective views illustrating the steps of manufacturing a lead frame according to a first preferred embodiment of the present invention;

DETAILED DESCRIPTION OF THE PREFERRED EMBODIMENTS

Figure 1:
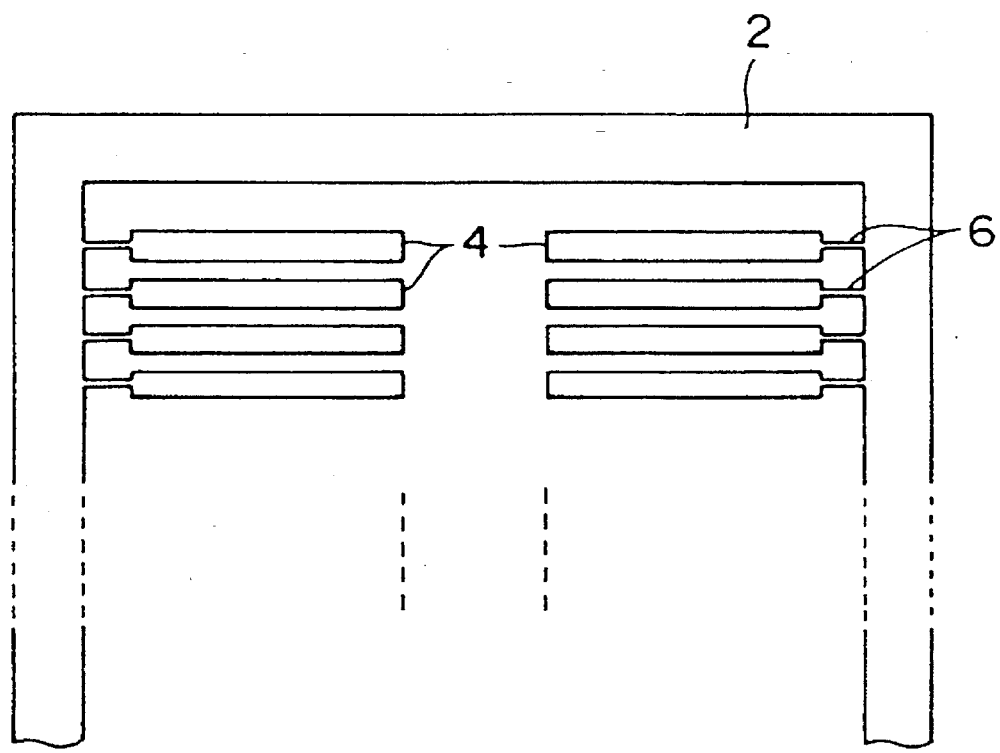
FIG. 1 is a plan view illustrating the formation of plural lead elements by blank etching.

Referring to FIG. 1, a plurality of lead elements 4 are formed integrally with a frame portion 2 by blank etching. Each lead element 4 is connected to the frame portion 2 by a connecting portion 6. The connecting portion 6 is thin enough to allow the corresponding lead element 4 to be easily separated from the frame portion 2. Any etched plate material such as 4-2 alloy and kovar may be used as a lead frame material. Specifically, the lead elements 4 may be formed by wet etching wherein etching resist of cyclized rubber or the like is used to mask the above plate material and etching liquid of ferric chlorides, peroxides, etc. is used to etch the plate material, thereby performing blanking by etching as shown in FIG. 1.

Referring to FIGS. 2A to 2D, there are shown the steps of manufacturing a lead frame according to a first preferred embodiment of the present invention. As shown in FIG. 2A, each lead element 4 obtained by the blank etching shown in FIG. 1 for example has a first surface 4A and a second surface 4B parallel to each other which constitute principal surfaces to be etched, and also has a first end 4C and a second end 4D that are opposite ends in the longitudinal direction of the lead element 4. Although the connecting portion 6 shown in FIG. 1 is integrally connected with the first end 4C or the second end 4D in actual, the connecting portion 6 is not shown in FIGS. 2A to 2D for the convenience of illustration. As shown in FIG. 2B, masks 8 and 10 are formed on the first surface 4A and the second surface 4B of the lead element 4, respectively. The masks 8 and 10 are formed of etching resist of cyclized rubber or the like, for example. The mask 8 formed on the first surface 4A extends from the first end 4C toward the second end 4D and terminates at a mid position between both ends 4C and 4D, whereas the mask 10 formed on the second surface 4B extends from the second end 4D toward the first end 4C and terminates at a mid position between both ends 4D and 4C. Then, the lead element 4 thus masked is subjected to etching to reduce the thickness of an unmasked portion of the lead element 4 as shown in FIG. 2C. In this etching process, etching liquid of ferric chlorides, peroxides, etc. is used.

Then, the masks 8 and 10 are removed to obtain a lead frame having a crank shape as viewed in vertical section as shown in FIG. 2D. In applying this lead frame to a multichip module, one of a portion of the lead frame on the first end 4C side and a portion of the lead frame on the second end 4D side is mounted on the multichip module, and the other is mounted on a mother board. In applying this lead frame to an IC chip, one of a portion of the lead frame on the first end 4C side and a portion of the lead frame on the second end 4D side is mounted on a body of the IC chip, and the other is mounted on a printed wiring board.

In the case where a plurality of lead frames formed above are integrally connected to the frame portion 2 as shown in FIG. 1, each lead element 4 may be separated from the frame portion 2 after each lead element 4 is mounted on the multichip module or the IC chip. According to this method, lead forming using a machine as in the conventional method can be eliminated to thereby easily manufacture the lead frames. In this preferred embodiment, as best shown in FIG. 2B, the masks 8 and 10 are partially overlapped at a substantially central portion of the lead element 4, so that this portion becomes greater in thickness than the other portion after the etching process. Accordingly, no greatly thin portion after the etching process is formed to thereby prevent a reduction in strength of the lead element 4.

Figure 3A:
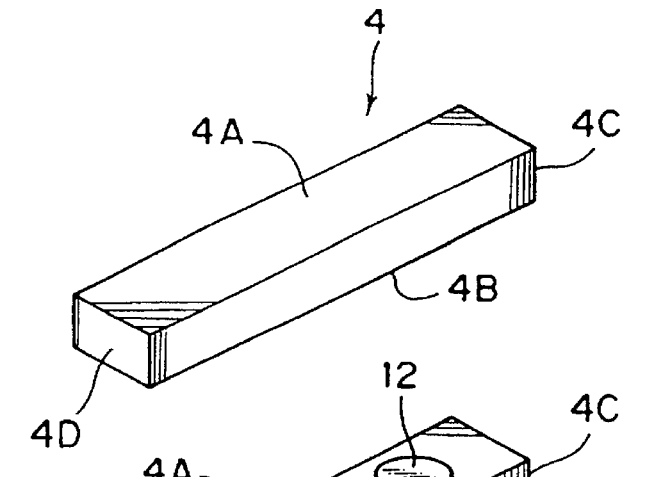
FIGS. 3A, 3B, 3C, and 3D are perspective views illustrating the steps of manufacturing a lead frame according to a second preferred embodiment of the present invention.
Figure 3B:
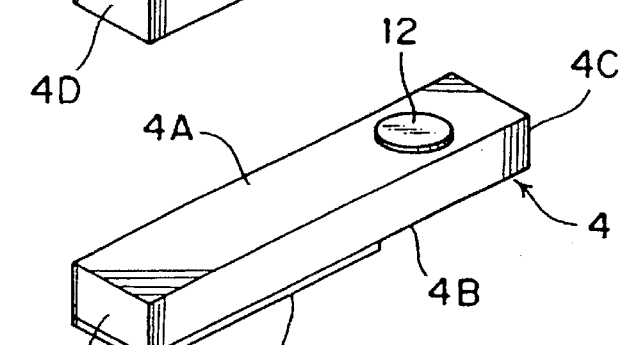
Figure 3C:
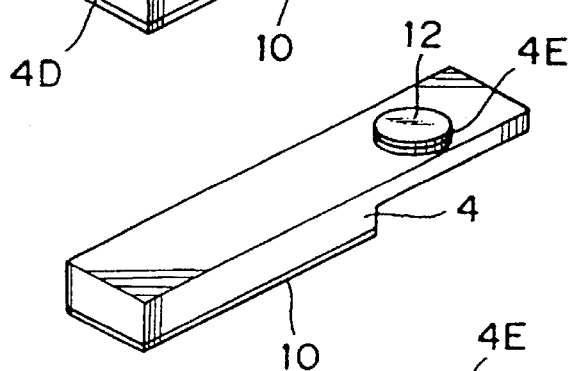
Figure 3D:
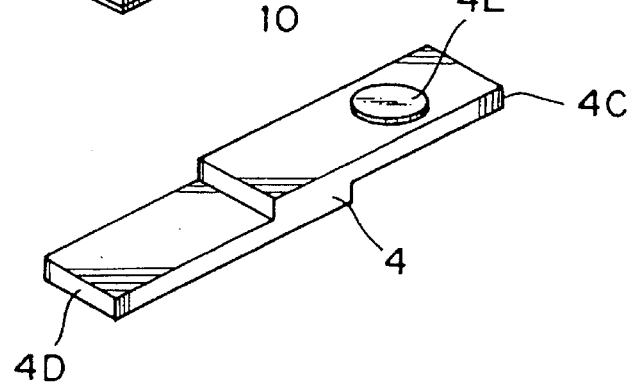

Referring next to FIGS. 3A to 3D, there are shown the steps of manufacturing a lead frame according to a second preferred embodiment of the present invention. In contrast to the first preferred embodiment shown in FIGS. 2A to 2D, the second preferred embodiment is featured by addition of the step of forming a projection on at least one of the first surface and the second surface of the lead element. As shown in FIG. 3A, a lead element 4 is formed in the same manner as that in the first preferred embodiment. To obtain the same crank shape as that in the first preferred embodiment, the lead element 4 having a thickness greater by the height of the projection than the thickness of the lead element 4 in the first preferred embodiment is formed as shown in FIG. 3A by blank etching shown in FIG. 1, for example. Then as shown in FIG. 3B, a mask 12 having a shape corresponding to the shape of the projection to be formed is formed on the first surface 4A of the lead element 4 at a portion on the first end 4C side. In this case where the projection to be formed is of a circular cylinder in shape as shown, the mask 12 has a circular shape. Like the first preferred embodiment, a mask 10 is formed on the second surface 4B of the lead element 4 at a portion on the second end 4D side. Then, the lead element 4 thus masked is subjected to etching to form the projection 4E on the first surface of the lead element 4 and a step on the second surface of the lead element 4 as shown in FIG. 3C. Then, the portion of the first surface of the lead element on which the projection 4E is formed is masked, and is subjected to etching to also form a step on the first surface of the lead element 4. Then, each mask is removed to obtain a lead frame having the projection 4E as shown in FIG. 3D.

In using the lead frame according to the second preferred embodiment, the portion of the lead element 4 on the second end 4D side is mounted on a multichip module or an IC chip, and the portion of the lead element 4 on the first end 4C side is mounted on a mother board or a printed wiring board. In this case, the top surface of the projection 4E may be soldered to the mother board or the printed wiring board, thereby allowing the connection of the lead frame to a fine conductor pattern or the connection of the lead frames to conductor patterns having a fine pitch.

Figure 4:
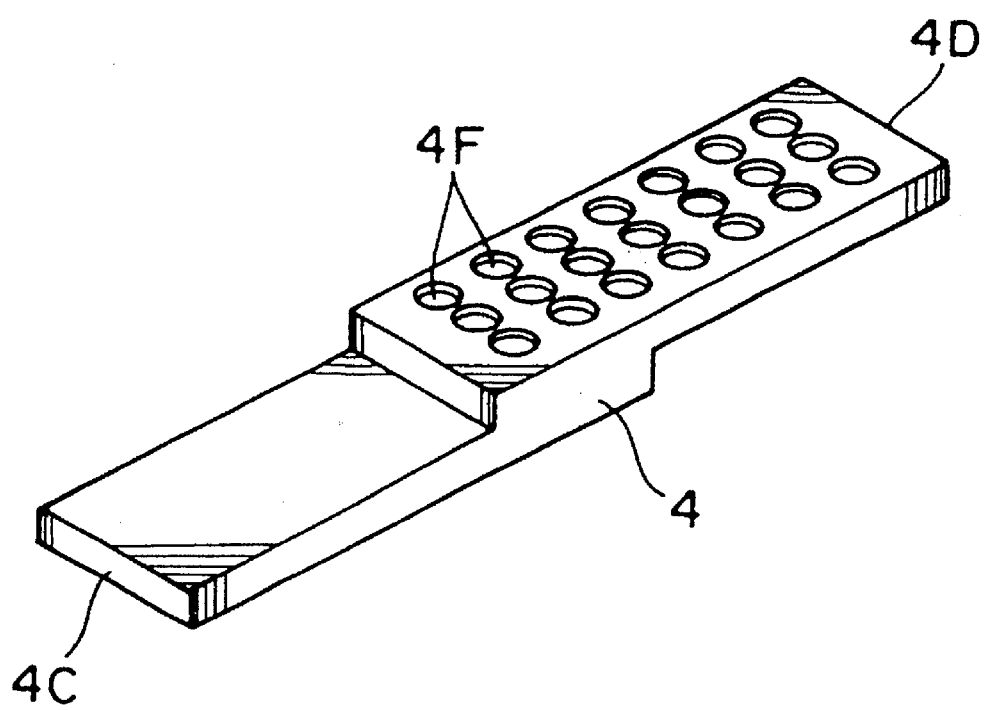
FIG. 4 is a perspective view of a lead frame according to a third preferred embodiment of the present invention.

Referring next to FIG. 4, there is shown a lead frame in perspective according to a third preferred embodiment of the present invention. In contrast to the second preferred embodiment shown in FIGS. 3A to 3D wherein one relatively large projection is formed on the lead element 4, the lead element 4 in the third preferred embodiment is formed with a plurality of relatively small recesses 4F instead of the projection 4E in the second preferred embodiment. Although the recesses 4F are formed on the first surface of the lead element 4 as shown in FIG. 4, they may be formed on the second surface of the lead element 4. The recesses 4F may be formed by forming a suitable mask on the first surface of the lead element 4 and then etching an unmasked portion of the first surface of the lead element 4. According to this preferred embodiment, a soldering area of the surface of the lead element 4 on which the recesses 4F are formed can be increased to thereby obtain an enough large soldering strength even in manufacturing a very small lead frame. Alternatively, the plural recesses 4F in the third preferred embodiment shown in FIG. 4 may be replaced by a plurality of projections to achieve the same object.

As described above, according to the present invention, a lead frame can be manufactured at low costs without the necessity of mechanical deformation of a lead element.

Having thus described some specific embodiments of the present invention, it should be understood that the preferred embodiments are merely illustrative and not limitative. It is to be noted that the scope of the invention is set out in the appended claims, and all changes and modifications that fall within equivalence of the claims are intended to be embraced by the claims.

What is claimed is:

1. A manufacturing method for a lead frame, comprising:

the first step of forming an elongated lead element having a first surface and a second surface parallel to each other;

the second step of forming a first mask on said first surface so that said first mask extends from a first end of said lead element toward a second end of said lead element and terminates at a mid position between said first end and said second end, and forming a second mask on said second surface so that said second mask extends from said second end toward said first end and terminates at a mid position between said second end and said first end;

the third step of etching said first surface and said second surface of said lead element; and the fourth step of removing said first mask and said second mask.

2. A manufacturing method for a lead frame according to claim 1, wherein said lead element has a portion at which said first mask and said second mask are partially overlapped.

3. A manufacturing method for a lead frame according to claim 1, wherein said lead element comprises a plurality of lead elements, and said first step includes the step of forming said plurality of lead elements by blank etching.

4. A manufacturing method for a lead frame according to claim 1, further comprising the step of forming a projection on at least one of said first surface and said second surface.

5. A manufacturing method for a lead frame according to claim 1, further comprising the step of forming a recess on at least one of said first surface and said second surface.

* * * * *